United States Patent
Yi et al.

(10) Patent No.: US 9,666,673 B2
(45) Date of Patent: May 30, 2017

(54) ELECTRONIC DEVICE HAVING CARBON LAYER AND METHOD FOR MANUFACTURING THE SAME

(75) Inventors: Gyuchul Yi, Seoul (KR); Chulho Lee, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/117,606

(22) PCT Filed: Aug. 31, 2012

(86) PCT No.: PCT/KR2012/006984
§ 371 (c)(1),
(2), (4) Date: Nov. 13, 2013

(87) PCT Pub. No.: WO2013/032268
PCT Pub. Date: Mar. 7, 2013

(65) Prior Publication Data
US 2015/0137114 A1    May 21, 2015

(30) Foreign Application Priority Data

Aug. 31, 2011 (KR) .................. 10-2011-0088019

(51) Int. Cl.
*H01L 29/16* (2006.01)
*H01L 29/66* (2006.01)
(Continued)

(52) U.S. Cl.
CPC ...... *H01L 29/1606* (2013.01); *H01L 21/0245* (2013.01); *H01L 21/0254* (2013.01); *H01L 21/0274* (2013.01); *H01L 21/0277* (2013.01); *H01L 21/02444* (2013.01); *H01L 21/02458* (2013.01); *H01L 21/02472* (2013.01); *H01L 21/02483* (2013.01); *H01L 21/02502* (2013.01); *H01L 21/02513* (2013.01); *H01L 21/02527* (2013.01); *H01L 21/02532* (2013.01); *H01L 21/02554* (2013.01); *H01L 21/263* (2013.01); *H01L 29/161* (2013.01);
(Continued)

(58) Field of Classification Search
None
See application file for complete search history.

(56) References Cited

U.S. PATENT DOCUMENTS 8,952,356 B2 * 2/2015 Kim ................ B82Y 10/00
257/29
2006/0289934 A1 * 12/2006 Tanabe et al. ............ 257/347
(Continued)

FOREIGN PATENT DOCUMENTS

KR    10-2011-0045252 A    5/2011

OTHER PUBLICATIONS

International Search Report for PCT/KR2012/006984.

Primary Examiner — Michael Jung
(74) Attorney, Agent, or Firm — The PL Law Group, PLLC

(57) ABSTRACT

According to one embodiment of the present invention, an electronic device includes: a carbon layer including graphene, a thin film layer formed on the carbon layer, a channel layer formed on the thin film layer, a current cutoff layer formed between the thin film layer and the channel layer so as to cut off the flow of current between the thin film layer and the channel layer, and a source electrode and a drain electrode formed on the channel layer.

26 Claims, 9 Drawing Sheets

(51) Int. Cl.
    *H01L 29/786* (2006.01)
    *H01L 21/02* (2006.01)
    *H01L 21/027* (2006.01)
    *H01L 21/263* (2006.01)
    *H01L 29/161* (2006.01)
    *H01L 29/201* (2006.01)
    *H01L 29/24* (2006.01)
    *H01L 29/778* (2006.01)
    *H01L 29/165* (2006.01)
    *H01L 29/20* (2006.01)
    *H01L 29/205* (2006.01)
    *H01L 29/225* (2006.01)

(52) U.S. Cl.
    CPC ............ *H01L 29/201* (2013.01); *H01L 29/24* (2013.01); *H01L 29/66015* (2013.01); *H01L 29/66431* (2013.01); *H01L 29/66462* (2013.01); *H01L 29/66742* (2013.01); *H01L 29/7786* (2013.01); *H01L 29/7787* (2013.01); *H01L 29/78603* (2013.01); *H01L 29/78684* (2013.01); *H01L 29/165* (2013.01); *H01L 29/2003* (2013.01); *H01L 29/205* (2013.01); *H01L 29/225* (2013.01)

(56) References Cited

U.S. PATENT DOCUMENTS

| | | | |
|---|---|---|---|
| 2010/0006823 A1* | 1/2010 | Anderson | H01L 29/1606 257/24 |
| 2010/0301336 A1 | 12/2010 | Babich et al. | |
| 2011/0017979 A1 | 1/2011 | Meric et al. | |
| 2011/0095268 A1* | 4/2011 | Choi et al. | 257/29 |
| 2011/0114918 A1* | 5/2011 | Lin et al. | 257/24 |
| 2011/0163289 A1* | 7/2011 | Zhu | 257/9 |
| 2011/0220865 A1* | 9/2011 | Miyata et al. | 257/12 |
| 2011/0240946 A1* | 10/2011 | Miao et al. | 257/3 |
| 2012/0168722 A1* | 7/2012 | Chung | H01L 29/1606 257/29 |
| 2012/0168865 A1* | 7/2012 | Liang et al. | 257/348 |
| 2012/0261673 A1* | 10/2012 | Schulze et al. | 257/77 |

* cited by examiner

ELECTRONIC DEVICE HAVING CARBON LAYER AND METHOD FOR MANUFACTURING THE SAME

CROSS REFERENCE TO RELATED APPLICATIONS AND CLAIM OF PRIORITY

This patent application is a National Phase application under 35 U.S.C. §371 of International Application No. PCT/KR2012/006984, filed Aug. 31, 2012, which claims priority to Korean Patent Application No. 10-2011-0088019 filed Aug. 31, 2011, entire contents of which are incorporated herein by reference.

BACKGROUND

1. Field of the Invention

The present invention relates to an electronic device and a method of manufacturing the same.

2. Description of the Related Art

A high-quality thin film, for example, a highly efficient thin film transistor (TFT), is required to manufacture an electronic device, such as an electronic device for driving a display device. Similarly, it is necessary to prepare a high-quality thin film on an inexpensive substrate, such as a glass substrate or a silicon substrate, in consideration of economical efficiency.

However, it is conventionally difficult to form a high-quality single crystalline thin film on a glass or silicon substrate due to differences in coefficients of thermal expansion and lattice constants between the substrate and the thin film. For instance, in the case of a liquid crystal display (LCD)—a typical display device—a TFT has been prepared on a large-area glass substrate using an amorphous silicon thin film. However, the TFT using the amorphous silicon thin film is technically limited in terms of performance and stability.

The present invention provides a technique of manufacturing a TFT using a high-quality thin film grown on a carbon layer including graphene. The graphene may be easily prepared on various substrates, and the thin film and the graphene may be easily transferred to other substrates after growing the thin graphene film.

The present invention is directed to providing an electronic device in which a thin film is formed on a carbon layer including graphene.

SUMMARY

One aspect of the present invention provides an electronic device including a carbon layer including graphene, a thin film layer formed on the carbon layer, a channel layer formed on the thin film layer, a current cutoff layer formed between the thin film layer and the channel layer and configured to cut off the flow of current between the thin film layer and the channel layer, and a source electrode and a drain electrode formed on the channel layer.

In an exemplary embodiment of the present invention, the electronic device may further include a plurality of fine structures grown upward from the carbon layer, and the thin film layer may cover the fine structures.

In an exemplary embodiment of the present invention, the fine structures may be selected from the group consisting of fine rods, fine needles, fine tubes, and fine walls.

In an exemplary embodiment of the present invention, the electronic device may further include a substrate disposed under the carbon layer.

In an exemplary embodiment of the present invention, the substrate and the carbon layer may be capable of being separated from each other.

In an exemplary embodiment of the present invention, the current cutoff layer may be formed of a material having a higher bandgap than the channel layer, or an insulating material.

In an exemplary embodiment of the present invention, the channel layer may be formed of a semiconductor material.

In an exemplary embodiment of the present invention, the channel layer includes a multilayered heterogeneous structure.

In an exemplary embodiment of the present invention, the channel layer is formed of any one of a pair of $Mg_xZn_{1-x}O$ and ZnO, a pair of $Al_xGa_{1-x}N$ and GaN, a pair of $Al_xGa_{1-x}As$ and GaAs, or a pair of Si and $Si_{1-x}Ge_x$.

In an exemplary embodiment of the present invention, the electronic device may further include a gate electrode formed on the channel layer using a Schottky junction.

In an exemplary embodiment of the present invention, the electronic device may further include a gate dielectric formed on the channel layer, and a gate electrode formed on the gate dielectric.

In an exemplary embodiment of the present invention, the thin film layer and the current cutoff layer may form a single layer.

In an exemplary embodiment of the present invention, the channel layer may include at least one doping layer.

The present invention further provides a method of manufacturing an electronic device, including the steps of: preparing a carbon layer including graphene, forming a thin film layer on the carbon layer, forming a current cutoff layer on the thin film layer, forming a channel layer on the current cutoff layer, and forming a source electrode and a drain electrode on the channel layer. The current cutoff layer cuts off the flow of current between the thin film layer and the channel layer.

In an exemplary embodiment of the present invention, the step of forming the thin film layer may include a step of growing a plurality of fine structures upward from the carbon layer, and the thin film layer may be formed to cover the fine structures.

In an exemplary embodiment of the present invention, the fine structures may be selected from the group consisting of fine rods, fine needles, fine tubes, and fine walls.

In an exemplary embodiment of the present invention, the step of preparing the carbon layer may be a step of preparing the carbon layer including graphene on a substrate.

In an exemplary embodiment of the present invention, the step of growing the fine structures may include the steps of generating a damage on the carbon layer, and growing the fine structures upward from the damage.

In an exemplary embodiment of the present invention, the step of generating the damage may include steps of forming a mask layer on the carbon layer, patterning the mask layer and forming a plurality of openings on the mask layer, and generating a damage on the carbon layer through the openings.

In an exemplary embodiment of the present invention, the step of generating the damage may consist of using at least one the methods consisting of gas plasma, ion beams, electronic beams (e-beams), proton beams, and neutron beams.

In an exemplary embodiment of the present invention, the step of forming the openings may use at least one of the processes consisting of an e-beam lithography process, a photolithography process, a laser interference lithography process, a nano-imprint process, and a template process.

In an exemplary embodiment of the present invention, the channel layer may include a multilayered heterogeneous structure.

In an exemplary embodiment of the present invention, the channel layer may be formed of any one of a pair consisting of $Mg_xZn_{1-x}O$ and ZnO, a pair of $Al_xGa_{1-x}N$ and GaN, a pair of $Al_xGa_{1-x}As$ and GaAs, or a pair of Si and $Si_{1-x}Ge_x$.

In an exemplary embodiment of the present invention, the method may further include a step of forming a gate electrode on the channel layer using a Schottky junction.

In an exemplary embodiment of the present invention, the method may further include the steps of forming a gate dielectric on the channel layer, and forming a gate electrode on the gate dielectric.

In an exemplary embodiment of the present invention, the thin film layer and the current cutoff layer may form a single layer.

The present invention can provide an electronic device in which a thin film is formed on a carbon layer including graphene. The electronic device may be a transistor for a display driver circuit. Also, according to the present invention, a functional element unit may be separated from a substrate and transferred to another substrate.

The effects of the present invention are not limited to the above-mentioned effects, and it should be understood that the effects of the present invention include all effects that can be inferred from the configuration of the invention described in the detailed description of the invention or the appended claims.

DETAILED DESCRIPTION

Figure 1:
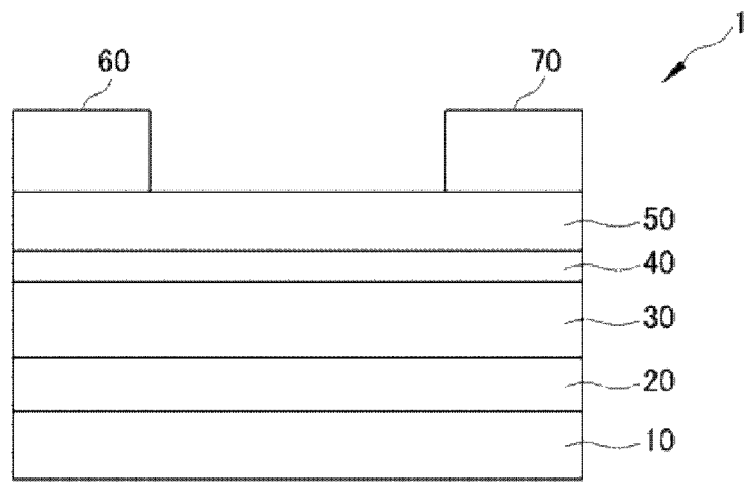
FIG. 1 is a schematic cross-sectional view of an electronic device according to an exemplary embodiment of the present invention.

Hereinafter, exemplary embodiments of the present invention will be described in detail. However, the present invention is not limited to the exemplary embodiments disclosed below, but can be implemented in various types. Therefore, the present exemplary embodiments are provided for complete disclosure of the present invention and to fully describe the scope of the present invention to those of ordinary skill in the art. Descriptions of irrelevant components are omitted from the drawings so as to clearly describe the exemplary embodiments of the present invention. Like elements are denoted by like reference numerals in the drawings.

Throughout this specification, it will be understood that when an element is referred to as being "connected" to another element, it can be "directly connected" to the other element or "electrically connected" to the other element with other elements therebetween. It will be further understood that when an element is referred to as "comprises" another element, the element is intended not to exclude one or more other elements, but to further include one or more other elements, unless the context clearly indicates otherwise.

Hereinafter, exemplary embodiments of the present invention will be described in detail with reference to the appended drawings.

Figure 2:
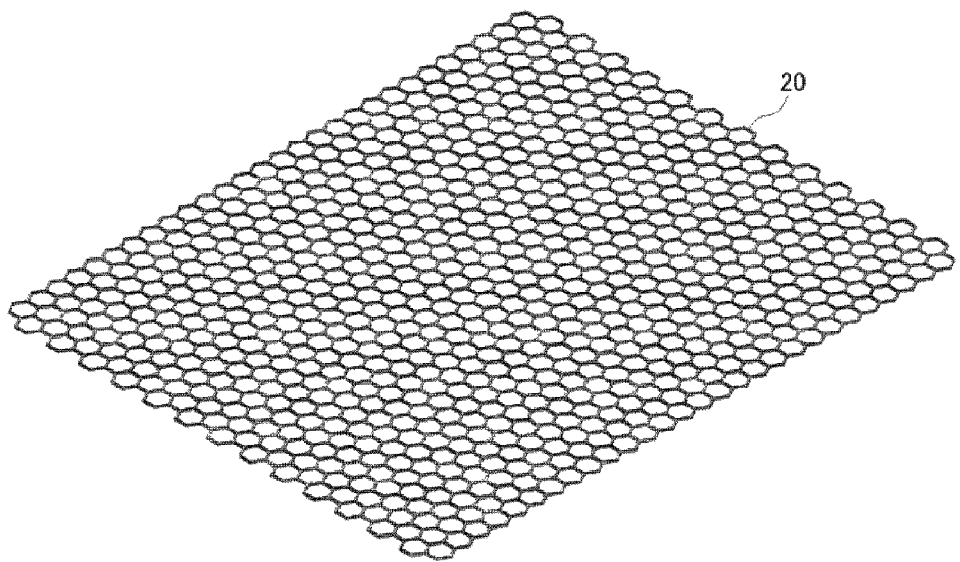
FIG. 2 is a schematic diagram of graphene.
Figure 3:
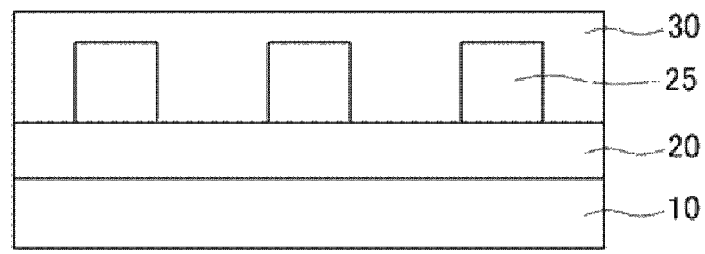
FIG. 3 is a detailed cross-sectional view of structures of a carbon layer and a thin film layer in the electronic device of FIG. 1.

FIG. 1 is a schematic cross-sectional view of an electronic device according to an exemplary embodiment of the present invention. FIG. 2 is a schematic diagram of graphene. FIG. 3 is a detailed cross-sectional view of structures of a carbon layer and a thin film layer in the electronic device of FIG. 1. FIGS. 4 through 8 are perspective views of several shapes of a fine structure. FIG. 9 is a schematic diagram of a transfer process of graphene.

Referring to FIG. 1, an electronic device 1 includes a substrate 10, a carbon layer 20 formed on the substrate 10, a thin film layer 30 formed on the carbon layer 20, a current cutoff layer 40 formed on the thin film layer 30, a channel layer 50 formed on the current cutoff layer 40, and a source electrode 60 and a drain electrode 70 formed on the channel layer 50.

The substrate 10 may be formed of any material, such as metal, glass, or resin. Materials for the substrate 10, for example, may include without limitation, silicon, silicon carbide, gallium arsenide, spinel, indium prints, gallium prints, prints of aluminum, gallium nitride, indium nitride, aluminum nitride, zinc oxide, magnesium oxide, aluminum oxide, titanium oxide, sapphire, quartz, and Pyrex.

The carbon layer 20 is disposed on the substrate 10. However, when the carbon layer 20 has a sufficient mechanical strength, the substrate 10 is not necessary. In this case, the carbon layer 20 may function as the substrate without any additional substrate 10.

In addition, the carbon layer 20 may be separated from the substrate 10. Thus, the carbon layer 20 and a structure disposed thereon (i.e., a functional element unit) may be separated from the substrate 10 and transferred. This will be described infra.

The carbon layer 20 includes at least one graphene layer. Graphene is a two-dimensional planar material in which carbon atoms are connected to one another to form a honeycomb structure, as shown in FIG. 2. Graphene may have various structures, and these structures of graphene vary according to the amount of five-membered and/or seven-membered rings that are present within the graphene. A multilayered graphene structure having at least two layers is graphite, namely, black lead. Therefore, graphene is obtained by separating only one layer from graphite.

The thin film layer 30 is a layer formed on the carbon layer 20 and configured to support a later-described current cutoff layer 40. As shown in FIG. 3, a plurality of fine structures 25 are formed on the carbon layer 20, and the thin film layer 30 may be formed to cover the fine structures 25.

A plurality of fine structures 25 are installed at arbitrary points on the carbon layer 20. The fine structures 25 are micro-scale or nano-scale structures, and the size or shape of the fine structures 25 are without limitation. Also, the fine structures 25 are grown upward from the carbon layer 20. The fine structures 25 may not be necessarily formed perpendicularly to the carbon layer 20, but formed using a bottom-up method with respect to a planar surface of the carbon layer 20, from a starting point corresponding to a contact point between the fine structure 25 and the carbon layer 20.

The fine structure 25 formed using a bottom-up method may be grown into a good crystalline structure having a very low dislocation density, despite a difference in material constants (e.g., lattice constants or coefficients of thermal expansion) between the fine structure 25 and the carbon layer 20. Thus, the fine structure 25 formed using a bottom-up method has a higher crystallinity and better mechanical and electrical properties than a structure manufactured using a top-down method that is based on a thin film deposition process and/or an etching process. Accordingly, the thin film layer 30 formed on the fine structure 25 also has excellent mechanical and electrical properties, thereby enabling the manufacture of a high-quality electronic device 1.

The fine structure 25 may be grown upward from the damage formed on the carbon layer 20, as described in detail infra.

Materials for the fine structures 25 are without limitation and may be, for example, zinc oxide, zinc magnesium oxide, zinc cadmium oxide, zinc magnesium cadmium oxide, zinc beryllium oxide, zinc magnesium beryllium oxide, zinc manganese oxide, zinc magnesium manganese oxide, gallium nitride, aluminum nitride, gallium aluminum nitride, or indium gallium nitride.

Figure 4:
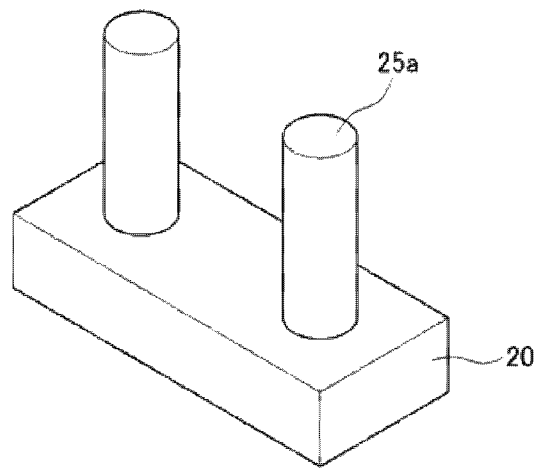
FIGS. 4 through 8 are perspective views of several shapes of fine structures.
Figure 5:
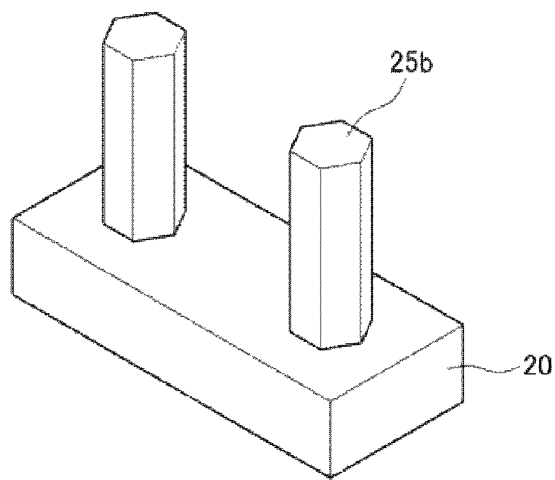
Figure 6:
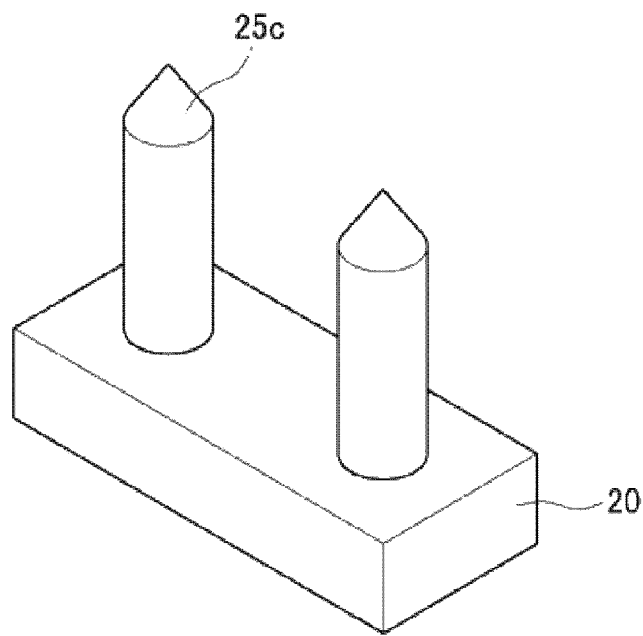
Figure 7:
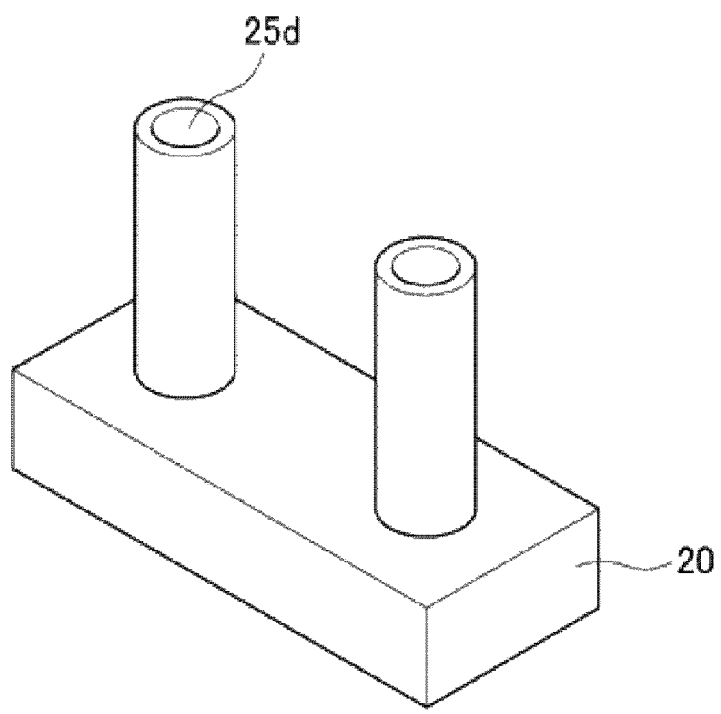
Figure 8:
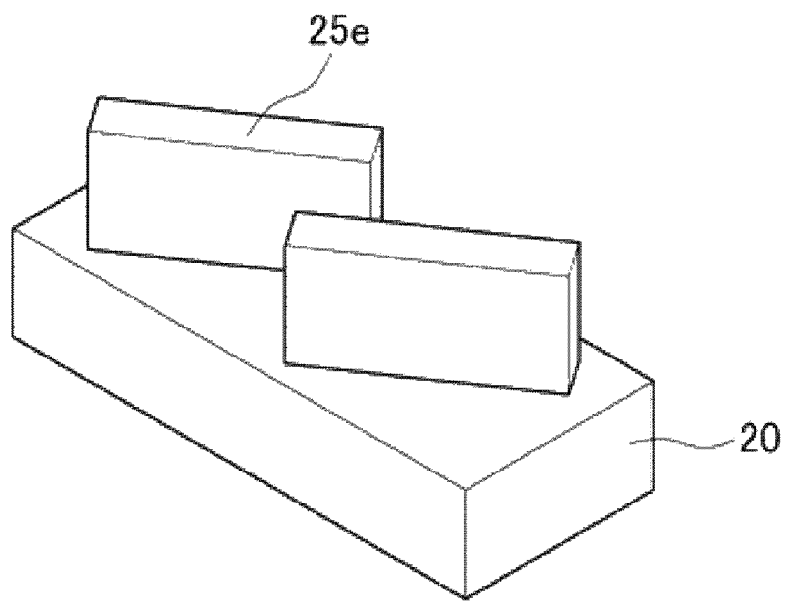
Figure 9:
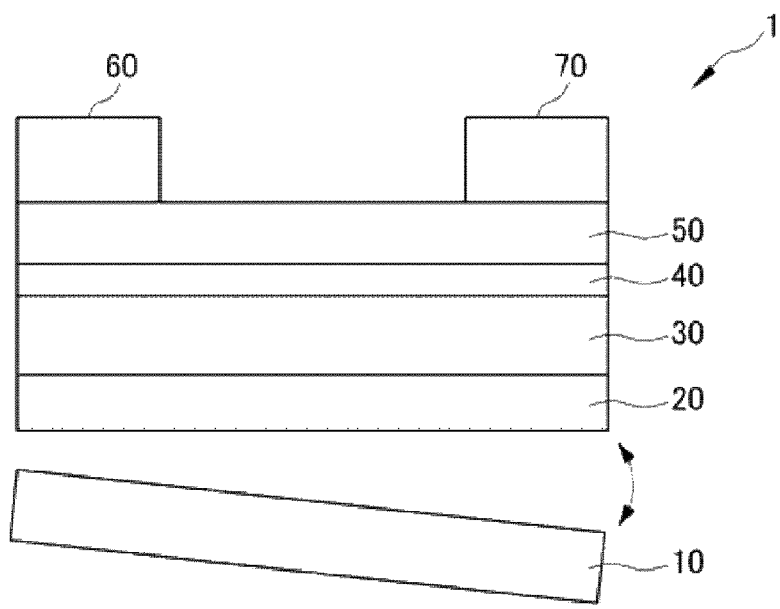
FIG. 9 is a schematic diagram of a transfer process of graphene.

The shape of the fine structures 25 are without limitation and may be, for example, fine rods 25a having a cylindrical shape as shown in FIG. 4, fine rods 25b having a polygonal pillar shape as shown in FIG. 5, fine needles 25c as shown in FIG. 6, fine tubes 25d as shown in FIG. 7, or fine walls 25e as shown in FIG. 8. The fine walls 25e may be a network structure wherein a plurality of walls are connected to one another. Accordingly, the terms "fine wall" or "fine walls" described in the present specification should be interpreted as including a fine wall network structure.

The thin film layer 30 is formed to cover the fine structures 25 (refer to FIG. 3). More specifically, the fine structures 25 and the thin film layer 30 are prepared such that the fine structures 25 are introduced into the thin film layer 30. The fine structures 25 function as a kind of seed layer for forming the thin film layer 30. In other words, although it is very hard to stack a thin film on graphene or graphite, it is easy to form the fine structures 25 on graphene or graphite and form the thin film layer 30 using the fine structures 25 as the seed layer.

Materials for the thin film layer 30 may be, without limitation, a nitride such as gallium nitride or an oxide such as zinc oxide. Since the current cutoff layer 40 is disposed on the thin film layer 30, the thin film layer 30 may be formed, without limitation, of a material other than an insulating material. Also, the thin film layer 30 may be formed of a material having a crystalline structure and lattice constant similar to those of the fine structures 25 so that the thin film layer 30 can be compatible with the fine structures 25.

The current cutoff layer 40 is formed between the thin film layer 30 and a later-described channel layer 50. The current cutoff layer 40 is a layer configured to cut off the flow of current between the thin film layer 30 and the channel layer 50. When the current cutoff layer 40 is not provided, a leakage current manifests from the channel layer 50 (e.g., a transistor) to the underlying thin film layer 30 or carbon layer 20, and the electronic device becomes inappropriate.

An insulating material or a material having a higher bandgap than the channel layer 50 may be used as a material for the current cutoff layer 40. More specifically, when the channel layer 50 is a semiconductor layer and a semiconductor material having a higher bandgap than the channel layer 50 is selected as the current cutoff layer 40, the flow of current may be cut off.

The channel layer 50 is disposed on the current cutoff layer 40 and functions as a channel in an electronic device, such as a transistor. To this end, the channel layer 50 may be a semiconductor film layer formed of a semiconductor material. Materials for the channel layer 50 include, without limitation, silicon, gallium nitride, gallium aluminum nitride, indium gallium nitride, zinc oxide, zinc magnesium oxide, indium gallium zinc oxide, indium arsenide, indium phosphide, or gallium arsenide. Also, at least one doping layer (not shown) may be inserted into the channel layer 50. When the channel layer 50 has a multilayered heterogeneous structure as described infra, a doping layer may be inserted into the channel layer 50.

The source electrode 60 and the drain electrode 70 are disposed on the channel layer 50 and are used as electrodes of a transistor. Materials for the source electrode 60 and the drain electrode 70 include, without limitation, a conductive material, for example, a metal such as aluminum (Al), gallium (Ga), indium (In), thallium (Tl), nickel (Ni), titanium (Ti), chromium (Cr), a transparent conductive oxide (TCO) such as indium tin oxide (ITO), indium zinc oxide (IZO), aluminum zinc oxide (AZO), or indium zinc tin oxide (IZTO), and a conductive polymer, or graphene may also be used.

As described above, physical and chemical properties of an electronic device according to an exemplary embodiment of the present invention rapidly improve using the carbon layer 20 including graphene. This is attributed to the following properties of graphene.

First, graphene has a very high electrical conductivity. Accordingly, the carbon layer 20 including graphene, itself, may be used as an electrode (e.g., a gate electrode as described in detail infra). Also, even if an additional electrode is installed on the carbon layer 20, contact resistance therebetween is low. When the carbon layer 20, itself, is used as an electrode, the electronic device is structurally simpler than when an additional electrode is installed, and process costs and time can be reduced.

In addition, graphene has high thermal conductivity. Accordingly, it is easy to manufacture a high-quality device when the electronic device 1 has excellent heat radiation characteristics. Also, graphene has high chemical and mechanical stability. In particular, graphene has excellent flexibility and ductility.

In addition, the graphene and a structure disposed thereon (i.e., a functional element unit) may be separated from the substrate 10 and transferred. As shown in FIG. 9, the carbon layer 20 including the graphene and the substrate 10 may be easily separated, and the separated carbon layer 20 and the structure disposed thereon (i.e., a functional element unit) may be transferred to another substrate. The carbon layer 20 and the substrate 10 may be separated only by mechanical force, and this process is called mechanical lift-off. It has experimentally been demonstrated that the carbon layer 20 and structures disposed thereon may be separated from the substrate 10 using mechanical lift-off and transferred to another substrate, for example, a sapphire substrate, a glass substrate, a metal substrate, and/or a resin substrate. Due to the above-described transfer characteristics, selection of a substrate is without limitation when it comes to manufacturing the electronic device 1. In other words, graphene and a structure disposed thereon may be formed on a convenient substrate, then separated from the original convenient substrate, and transferred to another substrate having desired characteristics. For example, the graphene and the structure disposed thereon may be freely transferred to a flexible, modifiable polymer substrate, a transparent substrate, or a high thermally conductive substrate.

BEST MODE FOR THE INVENTION

While an electronic device according to an exemplary embodiment of the present invention has been described thus far, an electronic device according to another exemplary embodiment of the present invention will now be described with reference to FIGS. 10 through 16. The same reference numerals are used to denote the same components as in the previously described embodiment, and thus repeated descriptions thereof will be omitted.

Figure 10:
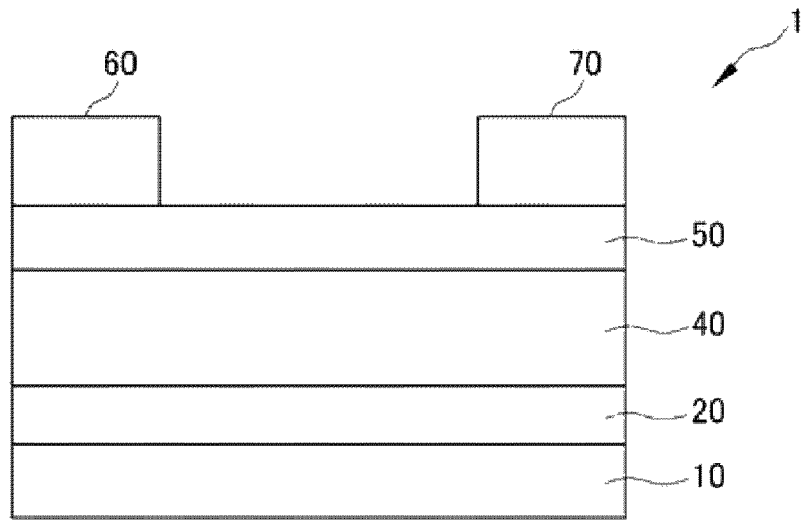
FIG. 10 is a schematic cross-sectional view of an electronic device according to another exemplary embodiment of the present invention.
Figure 11:
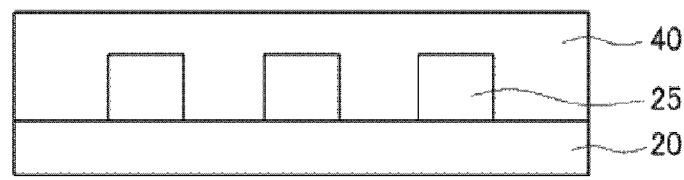
FIG. 11 is a detailed cross-sectional view of structures of a carbon layer and a current cutoff layer in the electronic device of FIG. 10.
Figure 12:
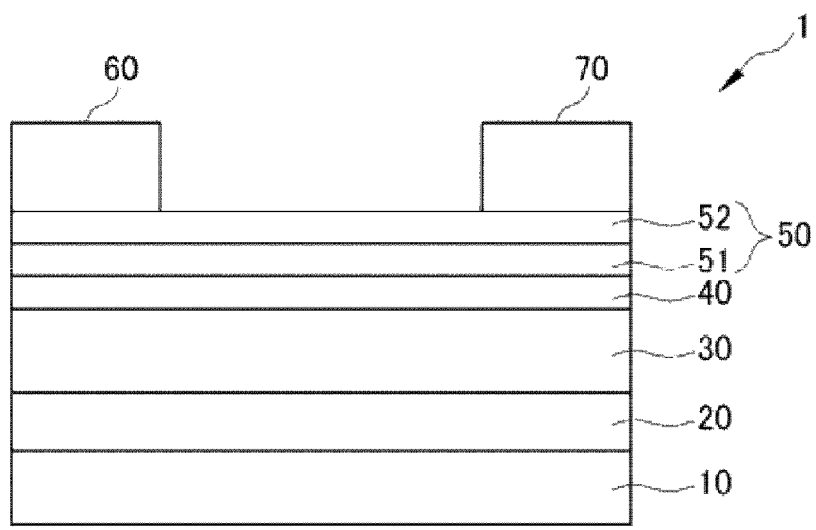
FIG. 12 is a schematic cross-sectional view of an electronic device according to another exemplary embodiment of the present invention.
Figure 13:
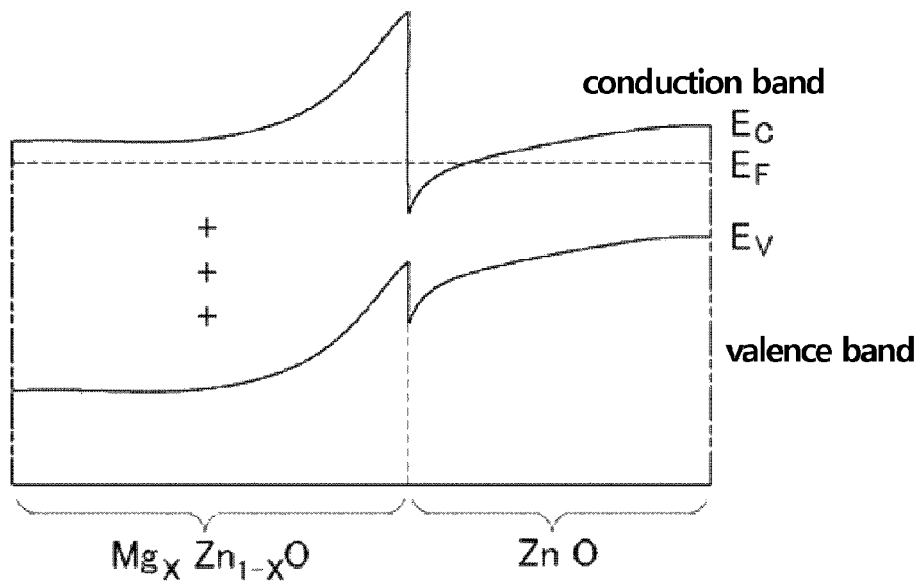
FIG. 13 is a schematic diagram of an energy band structure of a pair of $Mg_xZn_{1-x}O$ and ZnO.
Figure 14:
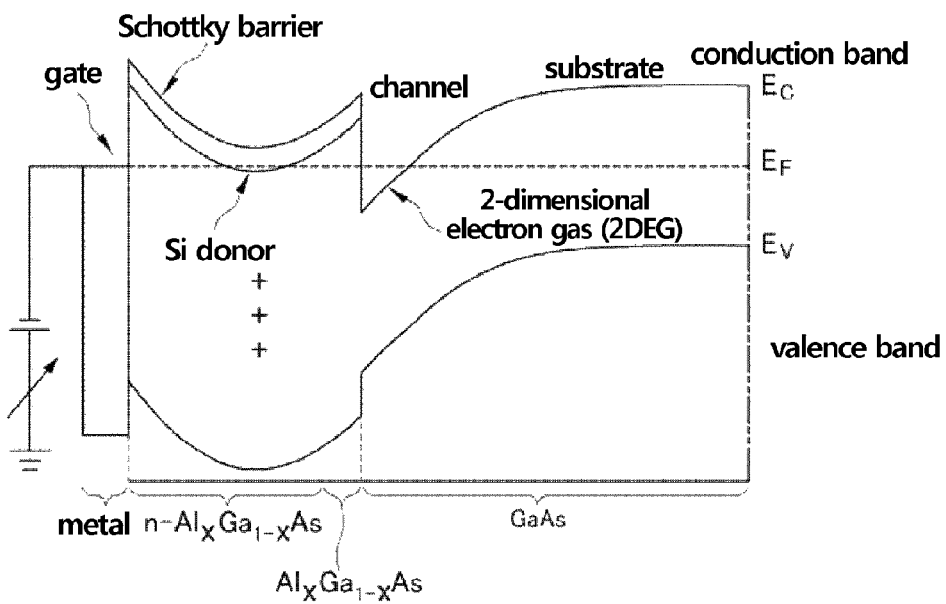
FIG. 14 is a schematic diagram of an energy band structure of a pair of $Al_xGa_{1-x}As$ and GaAs.
Figure 15:
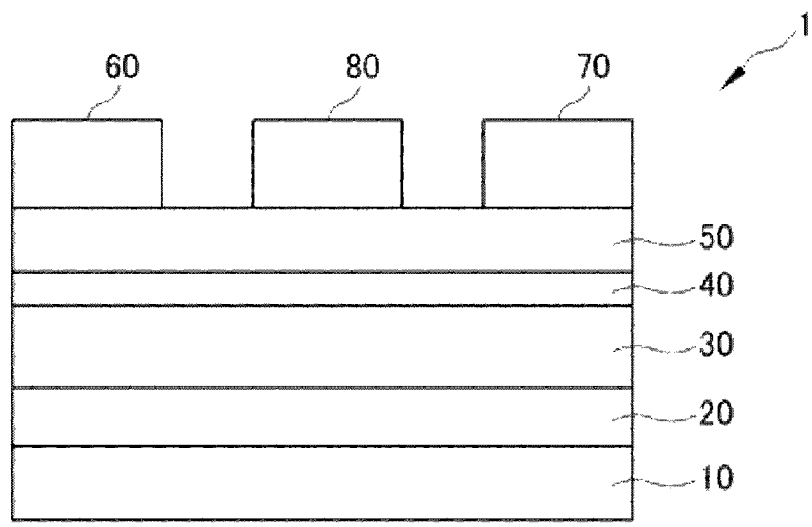
FIGS. 15 and 16 are schematic cross-sectional views of an electronic device according to another exemplary embodiment of the present invention.
Figure 16:
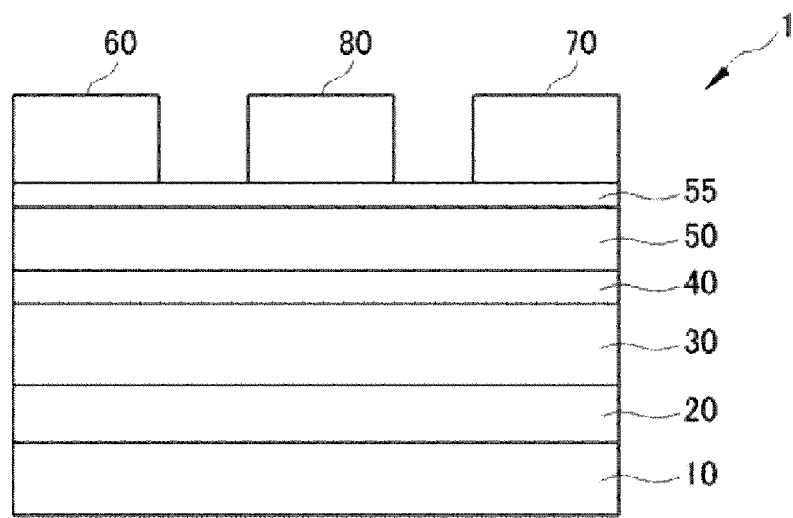

FIG. 10 is a schematic cross-sectional view of an electronic device according to another exemplary embodiment of the present invention. FIG. 11 is a detailed cross-sectional view of structures of a carbon layer and a current cutoff layer in the electronic device of FIG. 10. FIG. 12 is a schematic cross-sectional view of an electronic device according to another exemplary embodiment of the present invention. FIG. 13 is a schematic diagram of an energy band structure of a pair of $Mg_xZn_{1-x}O$ and ZnO. FIG. 14 is a schematic diagram of an energy band structure of a pair of $Al_xGa_{1-x}As$ and GaAs. FIGS. 15 and 16 are schematic cross-sectional views of an electronic device according to another exemplary embodiment of the present invention.

To begin, referring to FIG. 10, a thin film layer 30 is omitted in the present embodiment. A current cutoff layer 40 is disposed on a carbon layer 20. Accordingly, the current cutoff layer 40 serves the function of the omitted thin film layer 30. More specifically, the thin film layer 30 and the current cutoff layer 40 form a single layer.

Accordingly, as shown in FIG. 11, a plurality of fine structures 25 are formed on the carbon layer 20, and the current cutoff layer 40 is formed to cover the fine structures 25. The fine structures 25 serve as a kind of seed layer for forming the current cutoff layer 40. The current cutoff layer 40 may be formed of a material having a crystalline structure and lattice constant similar to those of the fine structures 25, so that the current cutoff layer 40 can be compatible with the fine structures 25. Also, an insulating material or a material having a higher bandgap than channel layer 50 may be used as a material for the current cutoff layer 40.

Next, referring to FIG. 12, within the present embodiment, the channel layer 50 may be formed of a multilayered heterogeneous structure, for example, a pair of a first channel layer 51 and a second channel layer 52. The first channel layer 51 and second channel layer 52 pair used may be without limitation, for example, a pair of $Mg_xZn_{1-x}O$ and ZnO, a pair of $Al_xGa_{1-x}N$ and GaN, a pair of $Al_xGa_{1-x}As$ and GaAs, or a pair of Si and $Si_{1-x}Ge_x$.

In the case of the pair of $Mg_xZn_{1-x}O$ and ZnO, $Mg_xZn_{1-x}O$ may have a higher bandgap than ZnO, and the bandgap of $Mg_xZn_{1-x}O$ may be controlled according to the Mg content. FIG. 13 illustrates an energy bandgap structure for the pair of $Mg_xZn_{1-x}O$ and ZnO. As can be seen from FIG. 13, a channel is formed at an interface between the $Mg_xZn_{1-x}O$ and ZnO, and may be applied to a high-speed electronic device. Also, a doping layer may be inserted between the $Mg_xZn_{1-x}O$ and ZnO.

In addition, a pair of $Al_xGa_{1-x}N$ and GaN or a pair of $Al_xGa_{1-x}As$ and GaAs may be used as the multilayered heterogeneous structure of the channel layer 50. These material systems are referred to as high-electron mobility transistors (HEMTs). FIG. 14 illustrates an HEMT energy band structure of AlGaAs and GaAs.

Next, referring to FIGS. 15 and 16, within the present embodiment, a gate electrode 80 is formed on the channel layer 50. As shown in FIG. 15, the gate electrode 80 may be formed on the channel layer 50 using a Schottky junction without a gate dielectric (e.g., a metal-semiconductor field effect transistor (MESFET) structure). In another case, as shown in FIG. 16, a gate dielectric 55 may be formed on the channel layer 50, and the gate electrode 80 may be formed on the gate dielectric 55 (e.g., a metal-oxide-semiconductor FET (MOSFET) structure).

When the above-described current cutoff layer 40 is formed from a material capable of serving as a gate dielectric, unlike the top gate structures shown in FIGS. 15 and 16, a bottom gate structure may be adopted. More specifically, the current cutoff layer 40 may function as a gate dielectric, and the thin film layer 30 may function as a gate electrode. The carbon layer 20, itself, may function as a gate in a structure wherein the thin film layer 30 is omitted. Since graphene has good electrical properties, graphene may be appropriately used for the gate electrode.

Configuration of the electronic device according to the exemplary embodiments of the present invention has been described thus far. Hereinafter, a method of manufacturing an electronic device according to an exemplary embodiment of the present invention will be described with reference to the appended drawings.

FIGS. 17 through 22 are cross-sectional views of sequential operations of a method of manufacturing an electronic device according to an exemplary embodiment of the present invention.

A method of manufacturing an electronic device according to an exemplary embodiment of the present invention includes a step of preparing a carbon layer 20 including graphene, a step of forming a thin film layer 30 on the carbon layer 20, a step of forming a current cutoff layer 40 on the thin film layer 30, a step of forming a channel layer 50 on the current cutoff layer 40, and a step of forming a source electrode 60 and a drain electrode 70 on the channel layer 50.

Figure 17:
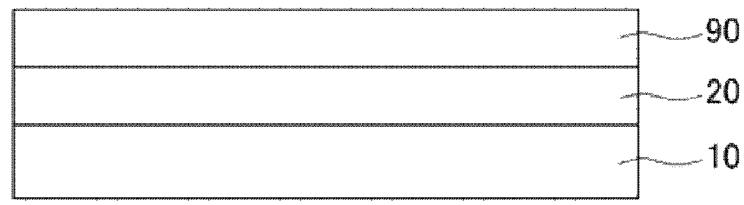
FIGS. 17 through 22 are cross-sectional views of sequential operations of a method of manufacturing an electronic device according to an exemplary embodiment of the present invention.

More specifically, to begin, as shown in FIG. 17, a substrate 10 is prepared on which a carbon layer 20 including graphene is formed thereon, and a mask layer 90 is coated on the carbon layer 20. However, the mask layer 90 is not necessary (as described infra), and a damage may be formed on the entire carbon layer 20. In this case, a fine structure network is formed.

A method of forming the carbon layer 20 including graphene on the substrate 10 may include, without limitation, a chemical vapor deposition (CVD) process. For example, graphene may be physically or chemically separated from single crystalline graphite and used. In addition to a typical CVD process, a rapid thermal CVD (RTCVD) process, a plasma-enhanced CVD (PECVD) process, an inductively coupled plasma (ICP) CVD process, or a metalorganic chemical vapor deposition (MOCVD) process may be used as the CVD process.

Although the present embodiment describes that the carbon layer 20 is disposed on the substrate 10, the carbon layer 20 itself may be used as a substrate, without the substrate 10.

Figure 18:
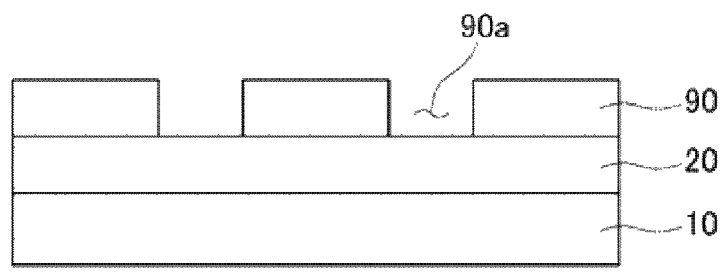

Next, as shown in FIG. 18, the mask layer 90 may be patterned to form a plurality of openings 90a. Methods of patterning the mask layer 90 are well known in semiconductor manufacturing processes. For example, an e-beam lithography process, a photolithography process, a laser interference lithography process, or a nano-imprint process may be used. Also, a pattering method using a template, such as anodic aluminum oxide (AAO) or a block copolymer, may be used.

Figure 19:
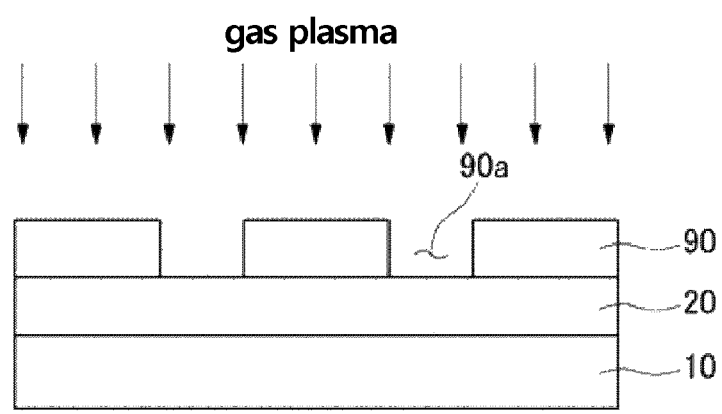

Thereafter, as shown in FIG. 19, a damage (not shown) is generated on a surface of the carbon layer 20 through the openings 90a formed in the mask layer 90. Methods for generating the damage include, without limitation gas plasma, as shown in FIG. 19, ion beams, e-beams, proton beams, or neutron beams. Gases used for the gas plasma method may include, without limitation, $O_2$, $N_2$, $Cl_2$, $H_2$, Ar, $CF_4$, $SF_6$, $BCl_3$, or ozone ($O_3$).

Figure 20:
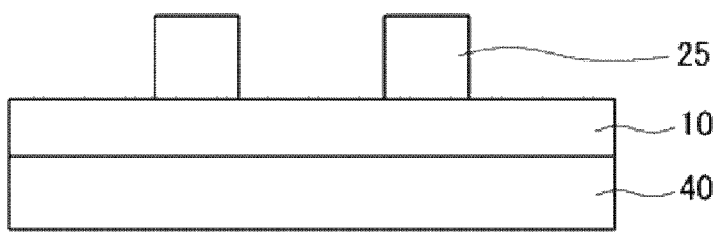

Next, as shown in FIG. 20, after growing fine structures 25 from the damage, the mask layer 90 is removed. The fine structures 25 may be, for example, fine rods, fine needles, fine tubes, or fine walls (cf. FIGS. 4 through 8).

As a method for growing the fine structures 25 on the carbon layer 20, a physical growth process, such as a CVD process including a MOCVD process, a sputtering process, a thermal or e-beam evaporation process, a pulse laser deposition (PLD), or a vapor-phase transport process using a metal catalyst, such as gold, may be used. When a catalyst-free MOCVD process is used, contamination caused by the catalyst may be eliminated, and fine structures 25 having excellent electrical and optical properties can be prepared.

In general, since the surface of graphene is very chemically stable and relatively inert, it is very difficult to grow a thin film or fine structures on the surface of graphene. More specifically, since materials are grown from only surface defects on graphene or step edges, it was conventionally impossible to form fine structures on a desired level.

However, according to a method of manufacturing an electronic device according to an exemplary embodiment of the present invention, by artificially applying damage to the surface of the graphene, nucleation and growth occur at the damage serving as a starting point. Accordingly, it is possible to generate fine structures on the surface of graphene and it also becomes easy to control the position and density of the fine structures.

Meanwhile, although the position and density of the fine structures 25 have been controlled thus far by performing a patterning process and generating the damage, this method is not necessarily performed. For example, it is possible to form the damage on the carbon layer 20 at random by directly performing a gas plasma etching process on the carbon layer 20 without using the mask layer 90. Also, it is possible to inject ion beams on the carbon layer 20 without using the mask layer 90. In this case, by controlling the injection position of the ion beams, the position and density of the fine structures 25 may be controlled without using the mask layer 90.

Furthermore, it is not necessary to generate the damage on the carbon layer 20 and grow the fine structures 25 from the damage serving as a starting point. For example, it is possible to grow the fine structures 25 directly on the carbon layer 20 by appropriately selecting process conditions, such as temperature and pressure.

Figure 21:
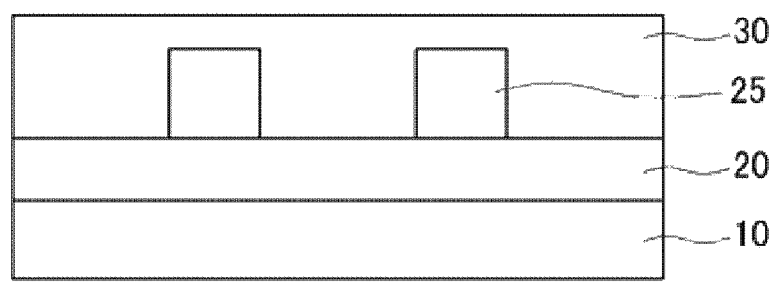

Next, as shown in FIG. 21, a thin film layer 30 is formed to completely cover the fine structures 25.

Figure 22:
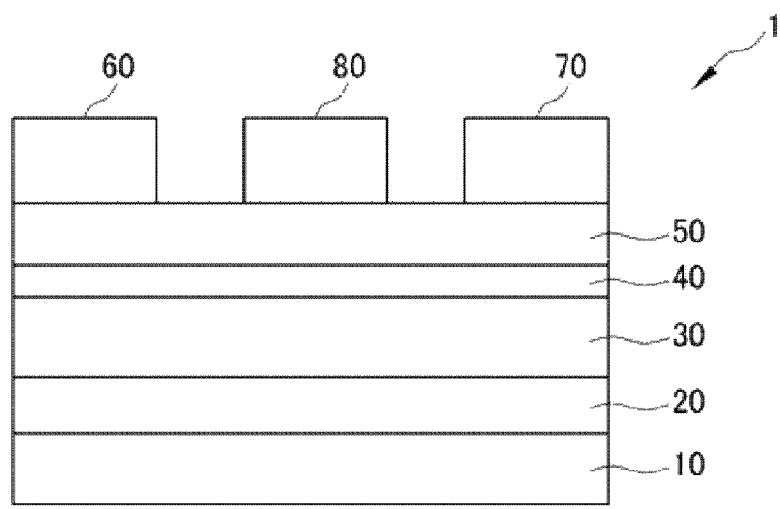

Next, as shown in FIG. 22, a current cutoff layer 40 followed by a channel layer 50 are formed on the thin film layer 30, and a source electrode 60 and a drain electrode 70 are formed on the channel layer 50.

The channel layer 50 may include a single layer or a multilayered heterogeneous structure. For example, the channel layer 50 may include any one of a pair of $Mg_xZn_{1-x}O$ and ZnO, a pair of $Al_xGa_{1-x}N$ and GaN, or a pair of $Al_xGa_{1-x}As$ and GaAs (cf. FIGS. 12 through 14).

A gate electrode 80 may be formed on the channel layer 50 using a Schottky junction (cf. FIG. 15). In other words, after forming a gate dielectric 55 on the channel layer 50, the gate electrode 80 may be formed on the gate dielectric 55 (cf. FIG. 16).

Next, although not shown, the thin film layer 30 and the current cutoff layer 40 may form a single layer. More specifically, the current cutoff layer 40 is disposed directly on the carbon layer 20. Accordingly, the current cutoff layer 40 serves the function of the thin film layer 30. More specifically, the thin film layer 30 and the current cutoff layer 40 form a single layer (cf. FIG. 10).

While this invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in an exemplary sense only and not for purposes of limitation. For example, each component referred to as a single type may be divided, and components referred to as being divided may be combined as a single type.

Therefore, the scope of the invention is defined not by the detailed description of the invention, but by the appended claims, and all differences within the scope will be construed as being included in the present invention.

The invention claimed is:

1. An electronic device comprising:
   a carbon layer including graphene;
   a thin film layer formed on the carbon layer;
   a current cutoff layer formed on the thin film layer;
   a channel layer formed on the current cutoff layer; and
   a source electrode and a drain electrode formed on the channel layer,
   wherein the carbon layer, the thin film layer, the current cutoff layer and the channel layer are stacked sequentially; and
   the current cutoff layer is formed of an insulating material or a material having a higher bandgap than the channel layer;
   wherein the electronic device has at least one of the following features:
   (i) a plurality of structures grown upward from the carbon layer, wherein the structures are micro-scale or nano-scale structures, and the thin film layer covers the structures; and
   (ii) the channel layer formed of any one of a pair of MgxZn1-xO and ZnO, a pair of AlxGa1-xN and GaN, a pair of AlxGa1-xAs and GaAs, and a pair of Si and Si1-xGex.

2. The electronic device of claim 1, wherein the electronic device has a plurality of structures grown upward from the carbon layer, wherein the structures are micro-scale or nano-scale structures, and the thin film layer covers the structures.

3. The electronic device of claim 2, wherein the structures are selected from the group consisting of a rod, a needle, a tube, and a wall.

4. The electronic device of claim 1, further comprising a substrate disposed under the carbon layer.

5. The electronic device of claim 4, wherein the substrate and the carbon layer are capable of being separated from each other.

6. The electronic device of claim 1, wherein the channel layer is formed from a semiconductor material.

7. The electronic device of claim 1, wherein the electronic device has a plurality of structures grown upward from the carbon layer, wherein the structures are micro-scale or nano-scale structures, and the thin film layer covers the structures; and the channel layer that includes a multilayered heterogeneous structure.

8. The electronic device of claim 7, the channel layer is formed of any one of a pair of $Mg_xZn_{1-x}O$ and ZnO, a pair of $Al_xGa_{1-x}N$ and GaN, a pair of $Al_xGa_{1-x}As$ and GaAs, and a pair of Si and $Si_{1-x}Ge_x$.

9. The electronic device of claim 1, further comprising a gate electrode formed on the channel layer using a Schottky junction.

10. The electronic device of claim 1, further comprising:
a gate dielectric formed on the channel layer; and
a gate electrode formed on the gate dielectric.

11. The electronic device of claim 1, wherein the thin film layer and the current cutoff layer form a single layer.

12. The electronic device of claim 1, wherein the channel layer includes at least one doping layer.

13. An electronic device comprising:
a carbon layer including graphene;
a current cutoff layer formed directly on the carbon layer;
a channel layer formed on the current cutoff layer; and
a source electrode and a drain electrode formed only on the channel layer,
wherein the carbon layer, the current cutoff layer and the channel layer are stacked sequentially; and
the current cutoff layer is formed of an insulating material or a material having a higher bandgap than the channel layer;
wherein the electronic device has at least one of the following features:
(i) a plurality of structures grown upward from the carbon layer, wherein the structures are micro-scale or nano-scale structures, and the thin film layer covers the structures; and
(ii) the channel layer formed of any one of a pair of $Mg_xZn_{1-x}O$ and ZnO, a pair of $Al_xGa_{1-x}N$ and GaN, a pair of $Al_xGa_{1-x}As$ and GaAs, and a pair of Si and $Si_{1-x}Ge_x$.

14. A method of manufacturing an electronic device comprising:
preparing a carbon layer including graphene;
forming a thin film layer on the carbon layer;
forming a current cutoff layer on the thin film layer;
forming a channel layer on the current cutoff layer; and
forming a source electrode and a drain electrode on the channel layer,
wherein the carbon layer, the thin film layer, the current cutoff layer and the channel layer are stacked sequentially; and
the current cutoff layer is formed of an insulating material or a material having a higher bandgap than the channel layer;
wherein the method has at least one of the following features:
(i) the formation of the thin film layer comprises growing a plurality of structures upward from the carbon layer, and the structures are micro-scale or nano-scale structures, and the thin film layer is formed to cover the structures; and
(ii) the channel layer formed of any one of a pair of $Mg_xZn_{1-x}O$ and ZnO, a pair of $Al_xGa_{1-x}N$ and GaN, a pair of $Al_xGa_{1-x}As$ and GaAs, and a pair of Si and $Si_{1-x}Ge_x$.

15. The method of claim 14, wherein the method has the formation of the thin film layer that comprises growing a plurality of structures upward from the carbon layer, wherein the structures are micro-scale or nano-scale structures, and the thin film layer is formed to cover the structures.

16. The method of claim 15, wherein the structures are selected from the group consisting of rods, needles, tubes, and walls.

17. The method of claim 15, wherein the growing of the structures comprises:
generating a damage on the carbon layer; and
growing the structures upward from the damage.

18. The method of claim 17, wherein the generating of the damage comprises:
forming a mask layer on the carbon layer;
patterning the mask layer and forming a plurality of openings on the mask layer; and
generating a damage on the carbon layer through the openings.

19. The method of claim 18, wherein the forming of the openings uses at least one of an e-beam lithography process, a photolithography process, a laser interference lithography process, a nano-imprint process, and a template process.

20. The method of claim 17, wherein the generating of the damage uses at least one of gas plasma, ion beams, electronic beams (e-beams), proton beams, and neutron beams.

21. The method of claim 14, wherein the preparing of the carbon layer is preparing the carbon layer including the graphene on a substrate.

22. The method of claim 14, wherein
the method has the formation of the thin film layer that comprises growing a plurality of structures upward from the carbon layer, and the structures are micro-scale or nano-scale structures, and the thin film layer is formed to cover the structures; and the channel layer that includes a multilayered heterogeneous structure.

23. The method of claim 22, wherein the channel layer is formed of any one of a pair of $Mg_xZn_{1-x}O$ and ZnO, a pair of $Al_xGa_{1-x}N$ and GaN, a pair of $Al_xGa_{1-x}As$ and GaAs, and a pair of Si and $Si_{1-x}Ge_x$.

24. The method of claim 14, further comprising forming a gate electrode on the channel layer using a Schottky junction.

25. The method of claim 14, further comprising:
forming a gate dielectric on the channel layer; and
forming a gate electrode on the gate dielectric.

26. The method of claim 14, wherein the thin film layer and the current cutoff layer form a single layer.

* * * * *